(12) United States Patent
Christo et al.

(10) Patent No.: US 10,394,996 B2
(45) Date of Patent: Aug. 27, 2019

(54) VIA ARRAY PLACEMENT ON A PRINTED CIRCUIT BOARD OUTLINE

(71) Applicant: International Business Machines Corporation, Armonk, NY (US)

(72) Inventors: Michael A. Christo, Round Rock, TX (US); David L. Green, Austin, TX (US); Julio A. Maldonado, Austin, TX (US); Diana D. Zurovetz, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 15/666,900

(22) Filed: Aug. 2, 2017

(65) Prior Publication Data

US 2019/0042686 A1    Feb. 7, 2019

(51) Int. Cl.
*G06F 17/50*    (2006.01)

(52) U.S. Cl.
CPC ...... *G06F 17/5072* (2013.01); *G06F 17/5081* (2013.01)

(58) Field of Classification Search
CPC .................... G06F 17/5072; G06F 17/5081
USPC .................... 716/118, 119, 136, 137, 139
See application file for complete search history.

(56) References Cited

U.S. PATENT DOCUMENTS

| 5,943,243 | A | * | 8/1999 | Sherlekar ............ G06F 17/5072 716/122 |
| 6,618,266 | B2 | | 9/2003 | Blakely et al. |
| 2004/0088670 | A1 | * | 5/2004 | Stevens ............... G06F 17/5077 716/129 |
| 2005/0278679 | A1 | | 12/2005 | Yaguchi et al. |
| 2008/0059932 | A1 | * | 3/2008 | Pfeil ....................... G06F 17/50 716/137 |
| 2009/0254874 | A1 | | 10/2009 | Bose |

(Continued)

FOREIGN PATENT DOCUMENTS

| WO | WO-2008/057598 A2 | 5/2008 |
| WO | WO-2014/120640 A1 | 8/2014 |
| WO | WO-2015/110200 A1 | 7/2015 |

OTHER PUBLICATIONS

Sie et al., *Optimized design of through-hole via in high-speed printed circuit board*, 11th International Microsystems, Packaging, Assembly and Circuits Technology Conference (IMPACT), Oct. 2016, pp. 401-404, IEEE Xplore Digital Library (ieee.org) online, Dec. 2016, DOI: 10.1109/IMPACT.2016.7800036.

*Primary Examiner* — Stacy Whitmore
(74) *Attorney, Agent, or Firm* — Jason H. Sosa

(57) ABSTRACT

Via array placement on a printed circuit board (PCB) outline including receiving, by a PCB design module, via array data from a user; generating, by the PCB design module, a via array based on the via array data from the user, including placing the via array on the PCB outline, wherein the via array comprises a grid of vias; detecting, by the PCB design module, that a first PCB element has been placed on top of a first portion of the via array on the PCB outline; removing, by the PCB design module, the first portion of the via array under the first PCB element, wherein a second portion of the via array remains on the PCB outline after removing the first portion of the via array; and generating, by the PCB design module, a PCB design document using the PCB outline and the second portion of the via array.

17 Claims, 8 Drawing Sheets

(56) References Cited

U.S. PATENT DOCUMENTS

| | | | |
|---|---|---|---|
| 2010/0199240 A1* | 8/2010 | Pfeil | G06F 17/50 716/137 |
| 2013/0154099 A1* | 6/2013 | Hunter | H01L 24/05 257/762 |
| 2014/0181775 A1* | 6/2014 | Fang | G06F 17/5072 716/122 |
| 2014/0284093 A1 | 9/2014 | Nagase et al. | |
| 2016/0007471 A1 | 1/2016 | Nagase et al. | |
| 2016/0183373 A1 | 6/2016 | Williams et al. | |

* cited by examiner

VIA ARRAY PLACEMENT ON A PRINTED CIRCUIT BOARD OUTLINE

BACKGROUND

Field of the Invention

The field of the invention is data processing, or, more specifically, methods, apparatus, and products for via array placement on a PCB outline.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for via array placement on a printed circuit board (PCB) outline are disclosed in this specification. Via array placement on a PCB outline includes receiving, by a PCB design module, via array data from a user; generating, by the PCB design module, a via array based on the via array data from the user, including placing the via array on the PCB outline, wherein the via array comprises a grid of vias; detecting, by the PCB design module, that a first PCB element has been placed on top of a first portion of the via array on the PCB outline; removing, by the PCB design module, the first portion of the via array under the first PCB element, wherein a second portion of the via array remains on the PCB outline after removing the first portion of the via array; and generating, by the PCB design module, a PCB design document using the PCB outline and the second portion of the via array.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
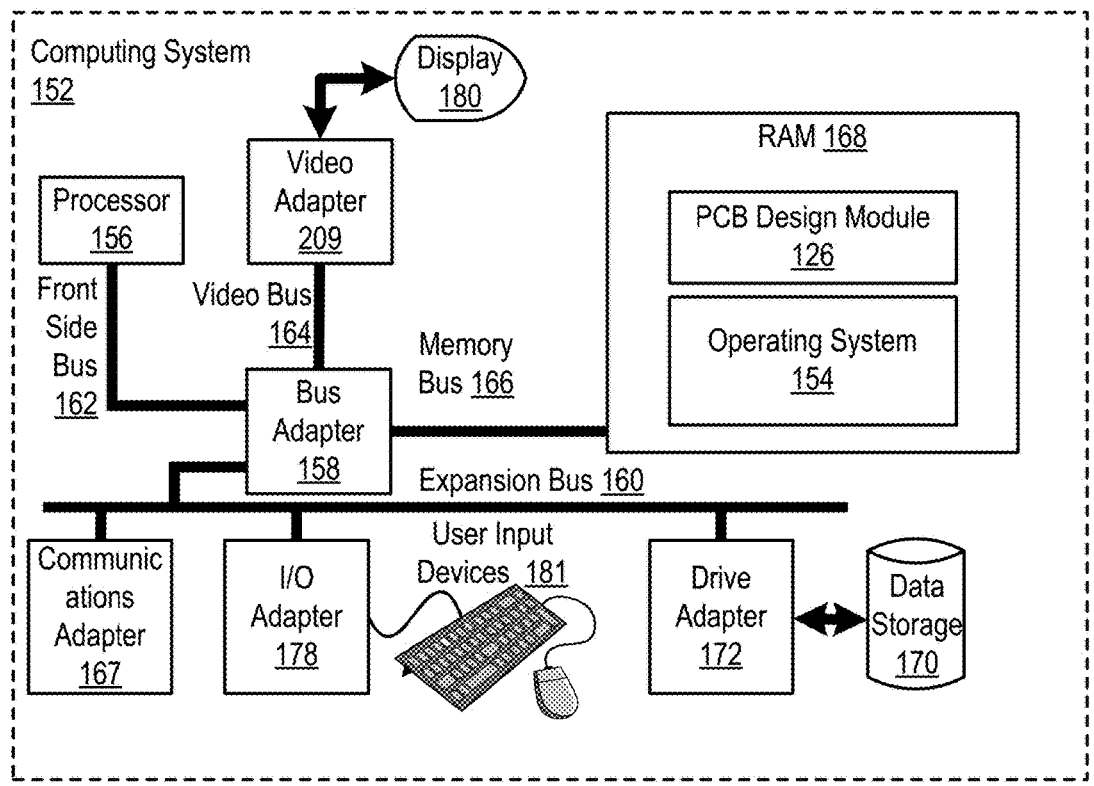
FIG. 1 sets forth a block diagram of an example system configured for via array placement on a printed circuit board (PCB) outline according to embodiments of the present invention.

Exemplary methods, apparatus, and products for via array placement on a PCB outline in accordance with the present invention are described with reference to the accompanying drawings, beginning with FIG. 1. FIG. 1 sets forth a block diagram of automated computing machinery comprising an exemplary computing system (152) configured for via array placement on a PCB outline according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for via array placement on a PCB outline according to embodiments of the present invention include UNIX™, Linux™, Microsoft Windows™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM is a PCB design module, a module for via array placement on a printed circuit board (PCB) outline according to embodiments of the present invention.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for via array placement on a PCB outline according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for via array placement on a PCB outline according to embodiments of the present invention include modems for wired dial-up communications, Ethernet (IEEE 802.3) adapters for wired data communications, and 802.11 adapters for wireless data communications.

Figure 2:
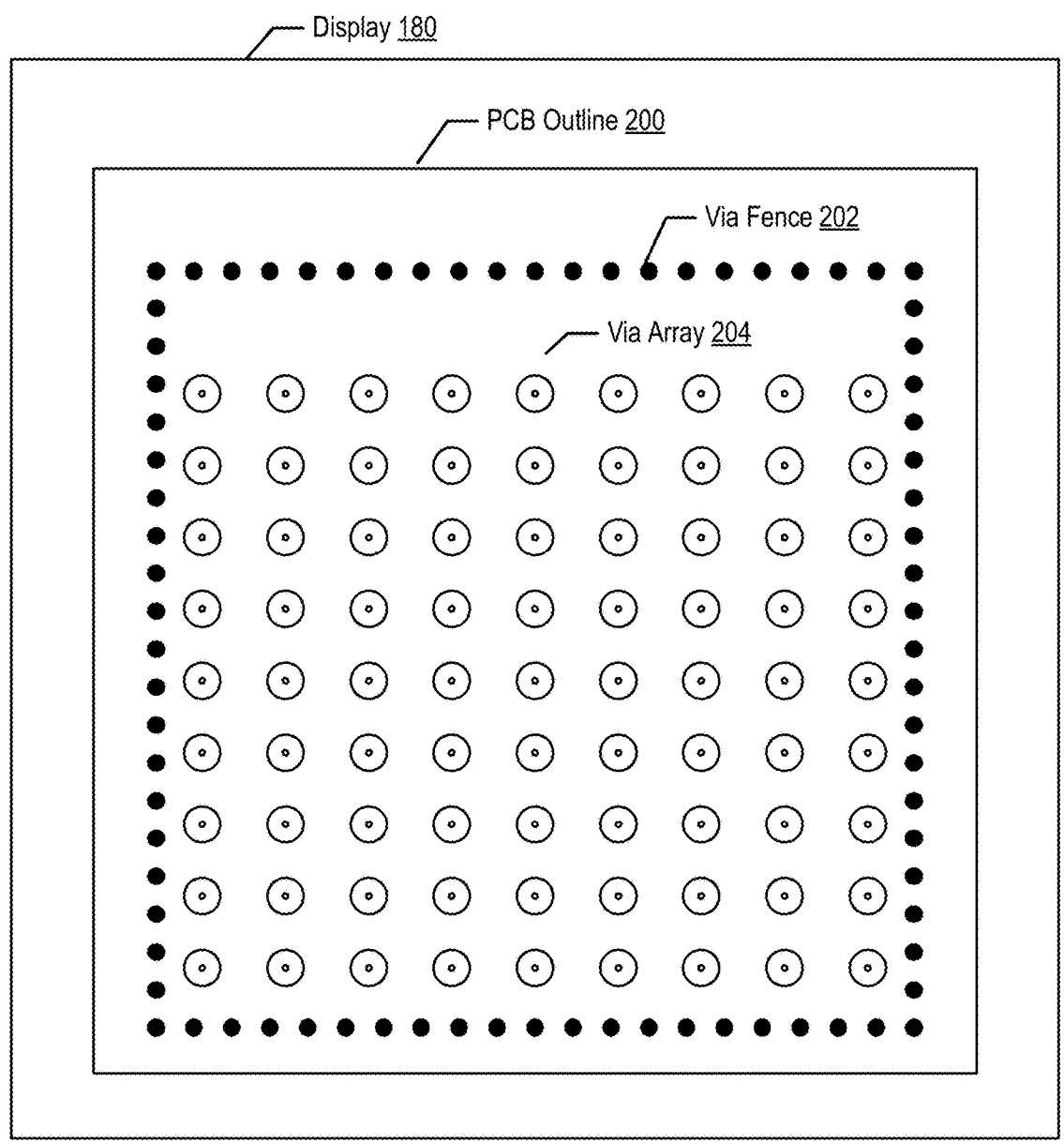
FIG. 2 sets forth a block diagram of an example system configured for via array placement on a PCB outline according to embodiments of the present invention.

FIG. 2 shows an exemplary block diagram of the visual presentation of a printed circuit board (PCB) design module for via array placement on a PCB outline according to embodiments of the present invention. As shown in FIG. 2, the exemplary block diagram includes a display (180), a PCB outline (200), a via fence (202), and a via array (204).

The display (180) presents to the user a configuration of a PCB outline (200). The PCB outline (200) is the visual presentation of a PCB design document that is generated, in part, by the PCB design module. The PCB design module is computer hardware, computer software, or an aggregation of both computer hardware or computer software configured to aid in designing a PCB for a computing system, specifically for via array placement on a PCB outline. The PCB design module may be utilized by, or be part of, a PCB computer aided drafting program.

A via, or via hole, is an electronic connection between layers in a physical electronic circuit, such as a PCB, that may pass through at least one plane of one or more adjacent layers.

The PCB outline is a representation of a PCB used to map out the location of PCB elements and generate a PCB design document that is used to physically generate the PCB. PCB elements include elements that may be placed on, etched in, or attached to the PCB. PCB elements include electronic components, such as processors, capacitors, resistors, switches, transistors, etc. PCB elements also include nets (i.e., traces) between components. The nets may be attached to the PCB, printed on to the PCB, or etched out of a pre-existing layer on the PCB.

FIG. 2 shows the visual presentation of the PCB design module after the via fence (202) and the via array (204) have been placed. The via fence (202) is a series of vias used to isolate areas of PCBs or to isolate the PCB from elements external to the PCB. The via fence (202) may prevent electromagnetic static discharge between elements on the PCB and other elements on the system.

The via fence (202) in FIG. 2 is a visual representation of a via fence for the PCB design document. The via fence (202) may be placed at the beginning of the PCB design process in order to ensure that enough space has been reserved for a via fence at the time the PCB design document is generated. Each via in the via fence (202) may be associated with via properties. The via properties may indicate the type of via (such as ground) and that the via is part of a via fence.

The via array (204) in FIG. 2 is a visual representation of a via array for the PCB design document. The via array (204) is a grid of vias used to visually reserve areas of the PCB in order to ensure that at least a portion of the vias in the via grid remain to act as ground vias or for other purposes at the end of the design process. Each via in the via array (204) may be associated with via properties. The via properties may indicate the type of via (such as ground) and that the via is part of a via array.

The via properties describe aspects of the associated via. The via properties may include information such as via size and via type. The via properties may also include limitations on the via, such as placement limitations, size limitations, and type limitations. Further, the via array properties may indicate any connections, such as nets, among vias or between vias and other components. The via properties may also reflect visual changes to the vias made by a user, such as color coding. The via properties for any individual via may be altered by a user or by the PCB design module.

Figure 3:
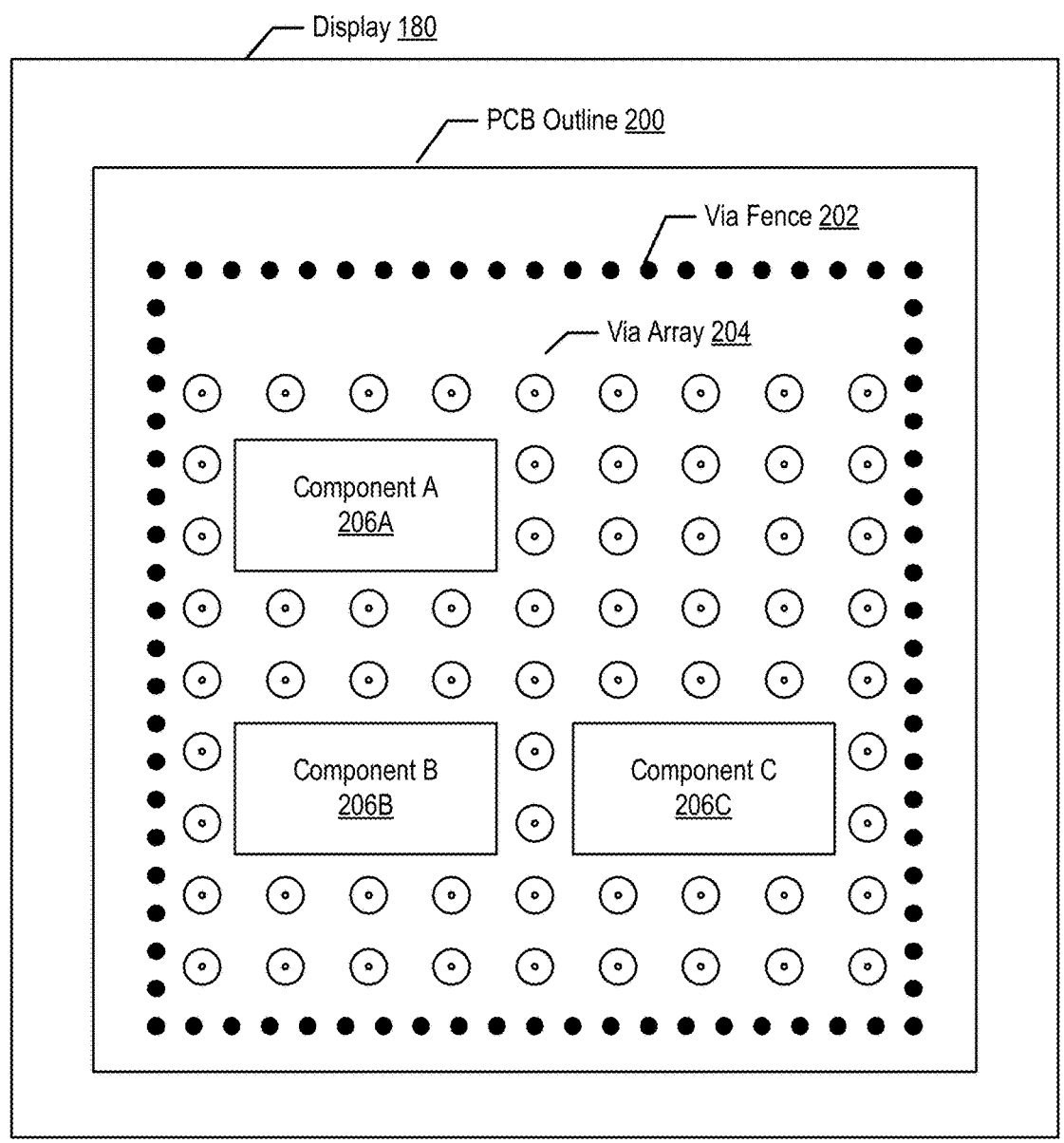
FIG. 3 sets forth a block diagram of an example system configured for via array placement on a PCB outline according to embodiments of the present invention.

FIG. 3 shows an exemplary block diagram of the visual presentation of a PCB design module for via array placement on a PCB outline according to embodiments of the present invention. Specifically, FIG. 3 shows the PCB outline from FIG. 2 after three electronic components (component A (206A), component B (206B), component C (206C)) have been placed. As shown in FIG. 3, the vias that made up the portion of the via array under each component (component A (206A), component B (206B), component C (206C)) have been removed from the via array (204). Specifically, a user may have used the PCB design module to place component A (206A), component B (206B), and component C (206C). In response to detecting that the components (component A (206A), component B (206B), component C (206C)) were placed on top of the group of vias, the visual representation of the vias has been removed, as has the inclusion of those vias in the PCB design document. The via properties for the removed vias may be maintained by the PCB design module in the event that the removed vias are reinstated.

Figure 4:
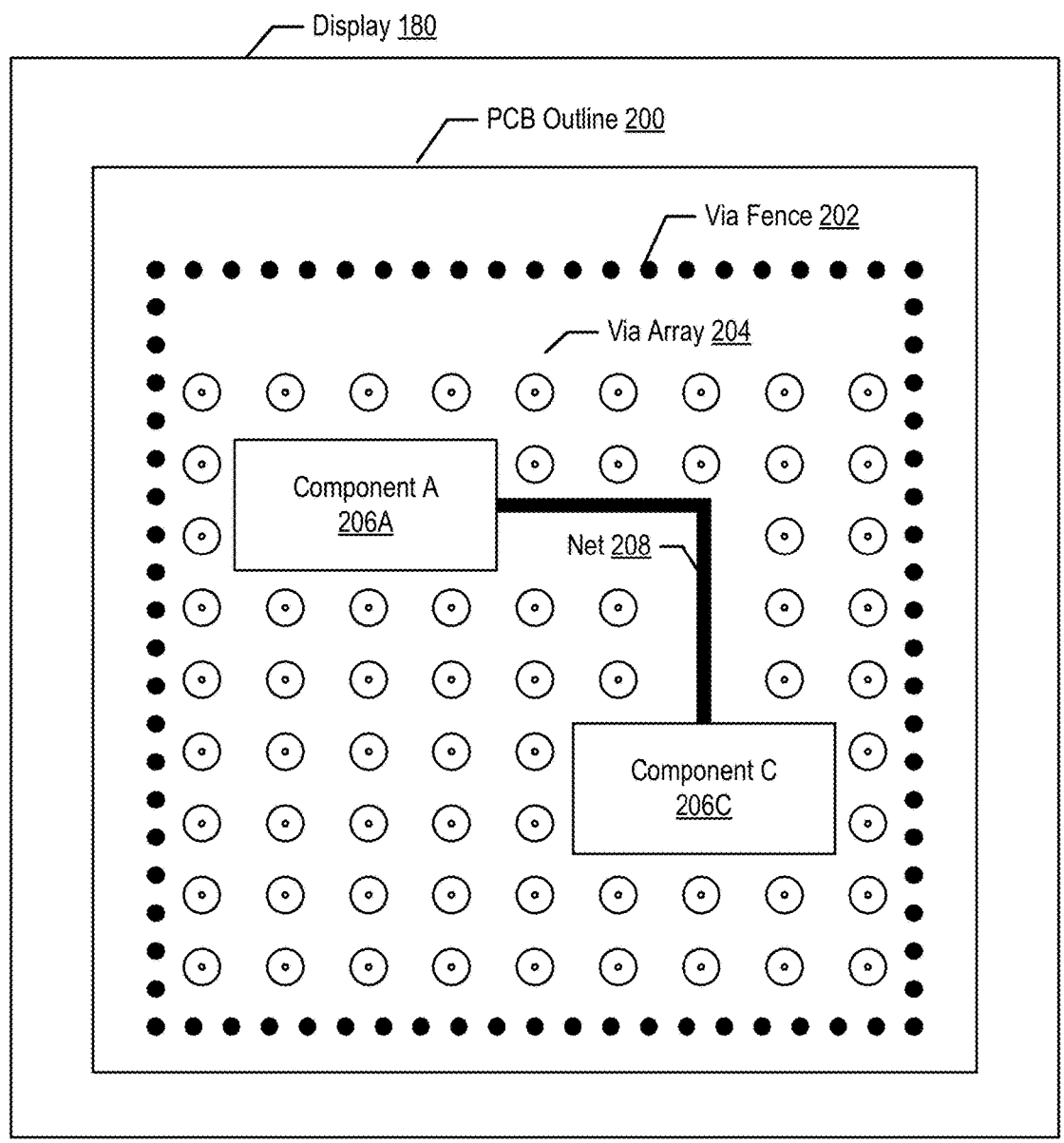
FIG. 4 sets forth a block diagram of an example system configured for via array placement on a PCB outline according to embodiments of the present invention.

FIG. 4 shows an exemplary block diagram of the visual presentation of a PCB design module for via array placement on a PCB outline according to embodiments of the present invention. Specifically, FIG. 4 shows the PCB outline from FIG. 3 after component B (206B) has been removed and net (208) has been added to connect component A (206A) to component C (206C). As shown in FIG. 4, the portion of vias that were removed in response to the initial placement of component B (206B), have been reinstated. Further, the vias that made up the portion of the via array under the net (208) have been removed in response to the placement of the net (208).

Figure 5:
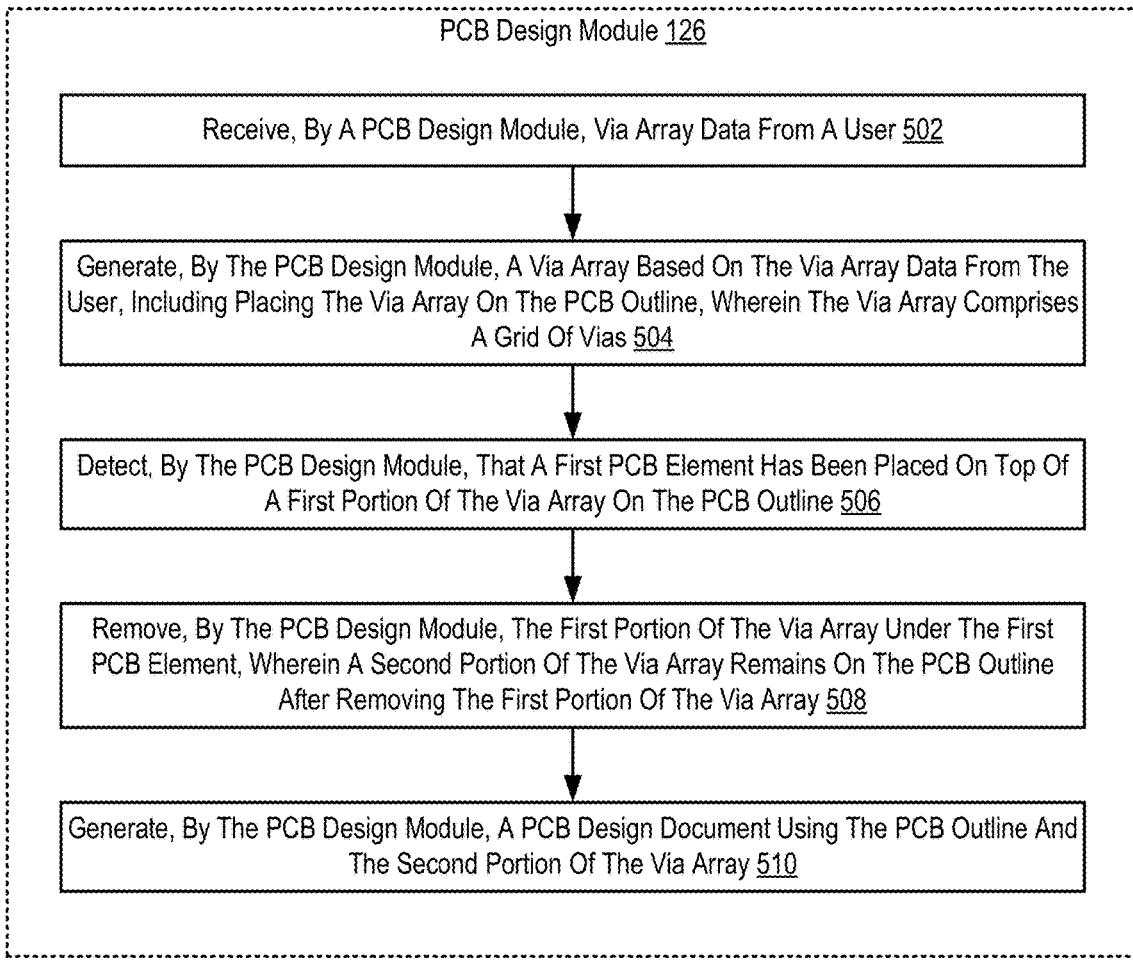
FIG. 5 sets forth a flow chart illustrating an exemplary method for via array placement on a PCB outline according to embodiments of the present invention.

For further explanation, FIG. 5 sets forth a flow chart illustrating an exemplary method for via array placement on a PCB outline according to embodiments of the present invention that includes receiving (502), by a PCB design module (126), via array data from a user. Receiving (502), by a PCB design module (126), via array data from a user may be carried out by presenting, by the PCB design module, a graphical user interface that presents options and properties for placing a via array. Options may include the area to be covered by the via array, the number of vias in the via array, the spacing between vias in the via array, etc. Properties may include the type of vias used for the via array, the individual size of each via in the via array, a relative importance of individual vias in the via array (e.g., a portion of vias that may only be removed for specific types of components), etc. A user may then select options and properties for the via array and submit the options and properties as the via array data with the request to the PCB design module.

The method of FIG. 5 further includes generating (504), by the PCB design module (126), a via array based on the via array data from the user, including placing the via array on the PCB outline, wherein the via array comprises a grid of vias. Generating (504), by the PCB design module (126), a via array based on the via array data from the user, including placing the via array on the PCB outline, wherein the via array comprises a grid of vias may be carried out by generating a visual representation of the via array on the presented PCB outline based on the options and properties in the via array data selected by the user.

Placing the via array on the PCB outline may include detecting keep-out regions on the PCB outline. The PCB outline may be configured with keep-out regions that indicate other vias, PCB elements, or other objects may not be placed in the region. The keep-out regions may be used to reserve space for objects not yet placed, or reserve space for objects placed that require additional area to operate. The PCB design module may generate an alert in response to detecting that user is attempting to place the via array in an area that includes a keep-out region. The PCB design module may also remove the portion of vias from the via array that have been placed in the keep-out regions.

Placing the via array on the PCB outline may also include detecting a via fence on the PCB outline and placing the via array without intersecting the via fence. An alert may be generated and presented to the user if the PCB design module detects that the via array, as requested, would intersect a via fence. The PCB design module may place the via array but remove a portion of the via array that would intersect, and go beyond, the via fence.

Further, placing the via array on the PCB outline may also include detecting pre-placed PCB elements on the board outline. In response, the PCB outline may generate an alert and present the alert to the user. Further, the portion of the via array that overlaps with the existing PCB elements may be removed and the remaining portion of the via array may be placed on the PCB outline.

The method of FIG. 5 further includes detecting (506), by the PCB design module (126), that a first PCB element has been placed on top of a first portion of the via array on the PCB outline. Detecting (506), by the PCB design module (126), that a first PCB element has been placed on top of a first portion of the via array on the PCB outline may be carried out by comparing the placement, or requested placement, of the PCB element to the location of the via array on the PCB outline.

The PCB design module may detect which of the vias in the via array may be affected by the placement of the PCB element. Determining the first portion affected by the PCB placement may include detecting the vias in the via array that would be underneath the PCB element. Determining the first portion affected by the PCB placement may include detecting the vias in the via array that are not underneath, but would also be affected by, the PCB element so as to necessitate the removal of the vias in order for the PCB element to operate properly.

The PCB design module may inspect the properties associated with the placed PCB element to determine the portion of vias in the via array to remove. Further, the PCB design module may also determine whether any of the vias in the via array are to be repurposed for utilization by the placed PCB element. The PCB element may require vias for proper operation, and may be able to utilize the existing vias in the via array. The vias may be used as ground vias or, alternatively, may be utilized in a different way, such as a connection to a power source.

The method of FIG. 5 further includes removing (508), by the PCB design module (126), the first portion of the via array under the first PCB element, wherein a second portion of the via array remains on the PCB outline after removing the first portion of the via array. Removing (508), by the PCB design module (126), the first portion of the via array under the first PCB element, wherein a second portion of the via array remains on the PCB outline after removing the first portion of the via array may be carried out by removing the visual representation of the first portion of vias from the PCB outline. The PCB design module may store information about the deleted first portion of vias in the event that the vias are reinstated.

Removing (508), by the PCB design module (126), the first portion of the via array may also include inspecting the via properties for each via in the first portion of the via array. The via properties may include protections on altering the individual via. For example, one via or a group of vias in the via array may be protected from removal. The PCB design module may generate an alert if the user places a PCB element over a via that may not be removed. Further, the via array may require a minimum number of vias in the via array, and the properties of each via may store the minimum number of vias required for the via array and the current number of vias in the via array. The PCB design module may generate an alert if the user places a PCB element over a via or group of vias whose removal would result in the fewer than required number of vias in the via array.

The method of FIG. 5 further includes generating (510), by the PCB design module (126), a PCB design document using the PCB outline and the second portion of the via array. Generating (510), by the PCB design module (126), a PCB design document using the PCB outline and the second portion of the via array may be carried out by storing or committing the changes to the PCB outline in computer memory. Generating (510), by the PCB design module (126), a PCB design document using the PCB outline and the second portion of the via array may also include generating the physical PCB using the PCB design document. The PCB may be printed or etched based on the content of the PCB design document.

Steps 504, 506, and 508, as described above, may be completed automatically by the PCB design module and without user intervention.

Figure 6:
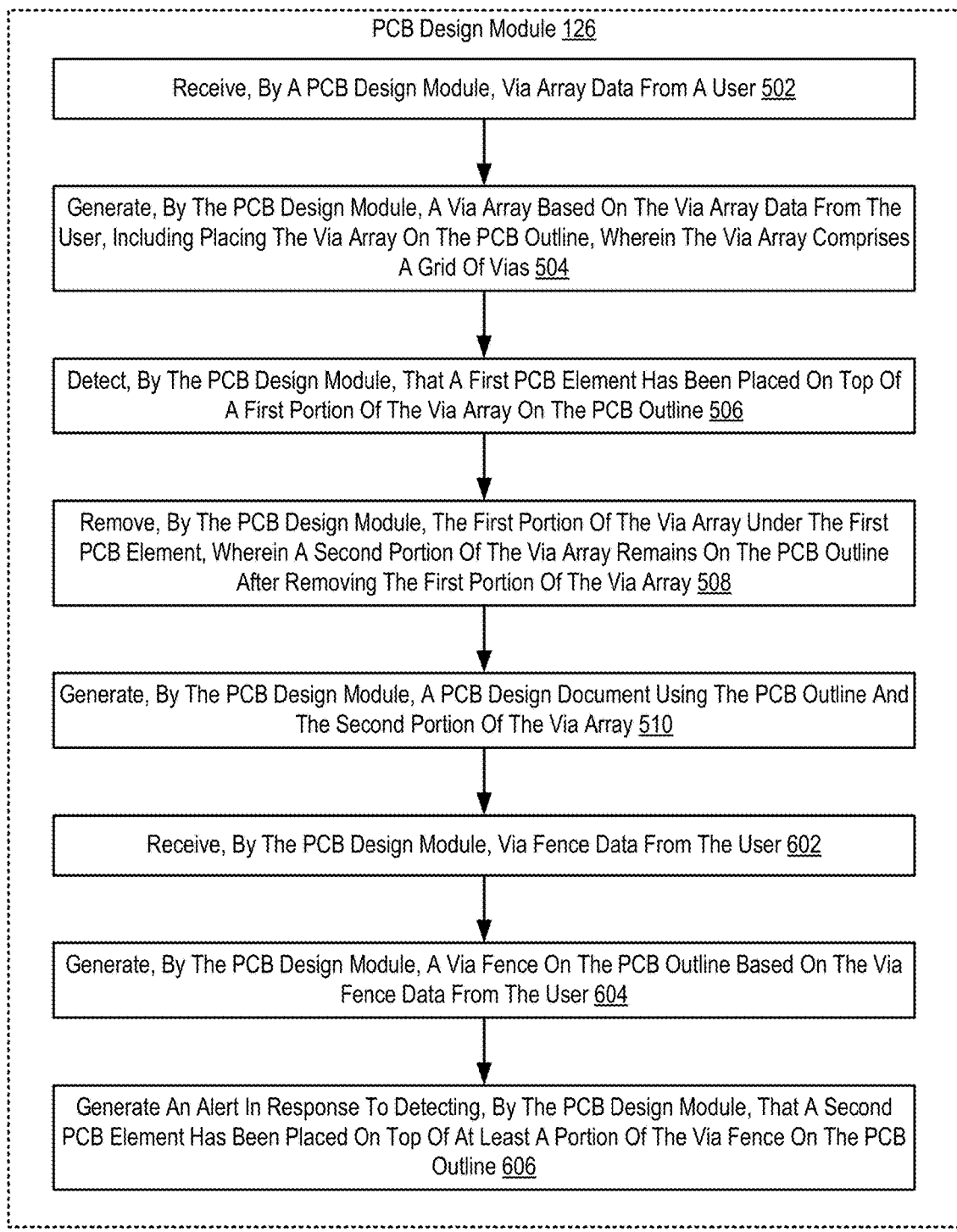
FIG. 6 sets forth a flow chart illustrating an exemplary method for via array placement on a PCB outline according to embodiments of the present invention.

For further explanation, FIG. 6 sets forth a flow chart illustrating a further exemplary method for via array placement on a PCB outline according to embodiments of the present invention that includes receiving (502), by a PCB design module (126), via array data from a user; generating (504), by the PCB design module (126), a via array based on the via array data from the user, including placing the via array on the PCB outline, wherein the via array comprises a grid of vias; detecting (506), by the PCB design module (126), that a first PCB element has been placed on top of a first portion of the via array on the PCB outline; removing (508), by the PCB design module (126), the first portion of the via array under the first PCB element, wherein a second portion of the via array remains on the PCB outline after removing the first portion of the via array; and generating (510), by the PCB design module (126), a PCB design document using the PCB outline and the second portion of the via array.

The method of FIG. 6 differs from the method of FIG. 5, however, in that the method of FIG. 6 further includes receiving (602), by the PCB design module (126), via fence data from the user. Receiving (602), by the PCB design module (126), via fence data from the user may be carried out by presenting, by the PCB design module, a graphical user interface that presents options and properties for placing a via fence. Options may include the area to be covered by the via fence, the number of vias in the via fence, the spacing between vias in the via fence, a margin between the via fence and the edge of the PCB, etc. Properties may include the type of vias used for the via fence, the individual size of each via in the via fence, a relative importance of individual vias in the via fence (e.g., a portion of vias that may only be removed for specific types of components), etc. A user may then select options and properties for the via fence and submit the options and properties as the via fence data with the request to the PCB design module.

The method of FIG. 6 further includes generating (604), by the PCB design module (126), a via fence on the PCB outline based on the via fence data from the user. Generating (604), by the PCB design module (126), a via fence on the PCB outline based on the via fence data from the user may be carried out by placing the via fence on PCB outline and presenting a visual representation of the via fence on the PCB outline.

Generating (604), by the PCB design module (126), a via fence on the PCB outline based on the via fence data from the user may be carried out by detecting keep-out regions on the PCB outline. The PCB design module may generate an alert in response to detecting that user is attempting to place the via fence in an area that includes a keep-out region. The PCB design module may also remove the portion of vias from the via fence that have been placed in the keep-out regions.

Generating (604), by the PCB design module (126), a via fence on the PCB outline based on the via fence data from the user may be carried out by detecting pre-placed PCB elements on the board outline. In response, the PCB outline may generate an alert and present the alert to the user. Further, the portion of the via fence that overlaps with the existing PCB elements may be removed and the remaining portion of the via fence may be placed on the PCB outline.

The method of FIG. 6 further includes generating (606) an alert in response to detecting, by the PCB design module (126), that a second PCB element has been placed on top of at least a portion of the via fence on the PCB outline. Detecting, by the PCB design module (126), that a second PCB element has been placed on top of at least a portion of the via fence on the PCB outline may be carried out by comparing the placement, or requested placement, of the second PCB element to the location of the via fence on the PCB outline.

The PCB design module may detect which of the vias in the via fence may be affected by the placement of the second PCB element. The PCB design module may also detect which vias within the via fence would be affected by the second PCB element so as to necessitate the removal of the vias in he via fence in order for the second PCB element to operate properly. Alternatively, the PCB design module may prevent the second PCB element from being placed over the via fence. The PCB design module may inspect the properties associated with the second PCB element to determine if a placement near the via fence will result in operational issues for either the via fence or the second PCB element. Generating (606) an alert in response to detecting, by the PCB design module (126), that a second PCB element has been placed on top of at least a portion of the via fence on the PCB outline may be carried out by presenting the alert to the user.

Figure 7:
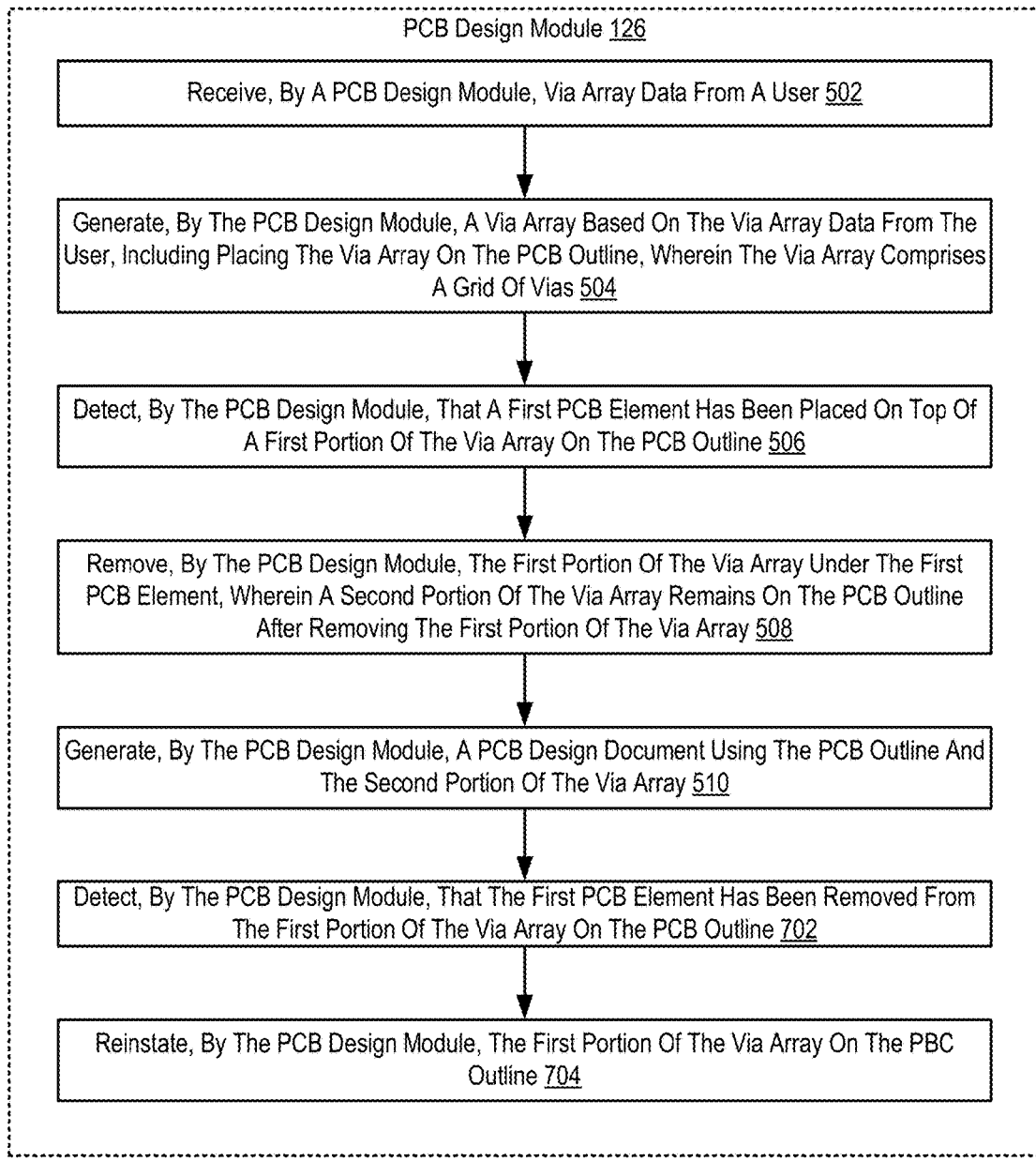
FIG. 7 sets forth a flow chart illustrating an exemplary method for via array placement on a PCB outline according to embodiments of the present invention.

For further explanation, FIG. 7 sets forth a flow chart illustrating a further exemplary method for via array placement on a PCB outline according to embodiments of the present invention that includes receiving (502), by a PCB design module (126), via array data from a user; generating (504), by the PCB design module (126), a via array based on the via array data from the user, including placing the via array on the PCB outline, wherein the via array comprises a grid of vias; detecting (506), by the PCB design module (126), that a first PCB element has been placed on top of a first portion of the via array on the PCB outline; removing (508), by the PCB design module (126), the first portion of the via array under the first PCB element, wherein a second portion of the via array remains on the PCB outline after removing the first portion of the via array; and generating (510), by the PCB design module (126), a PCB design document using the PCB outline and the second portion of the via array.

The method of FIG. 7 differs from the method of FIG. 5, however, in that the method of FIG. 7 further includes detecting (702), by the PCB design module (126), that the first PCB element has been removed from the first portion of the via array on the PCB outline. Detecting (702), by the PCB design module (126), that the first PCB element has been removed from the first portion of the via array on the PCB outline may be carried out by receiving a request from the user to remove the first PCB element. The PCB design module may, in response, remove the first PCB element from the PCB outline.

The method of FIG. 7 further includes reinstating (704), by the PCB design module (126), the first portion of the via array on the PBC outline. Reinstating (704), by the PCB design module (126), the first portion of the via array on the PBC outline may be carried out by retrieving the via properties associated with each of the vias in the first portion of the via array. The PCB design module may use the via properties of the vias in the first portion of the via array to place the first portion of the via array in the previous location of the vias.

Figure 8:
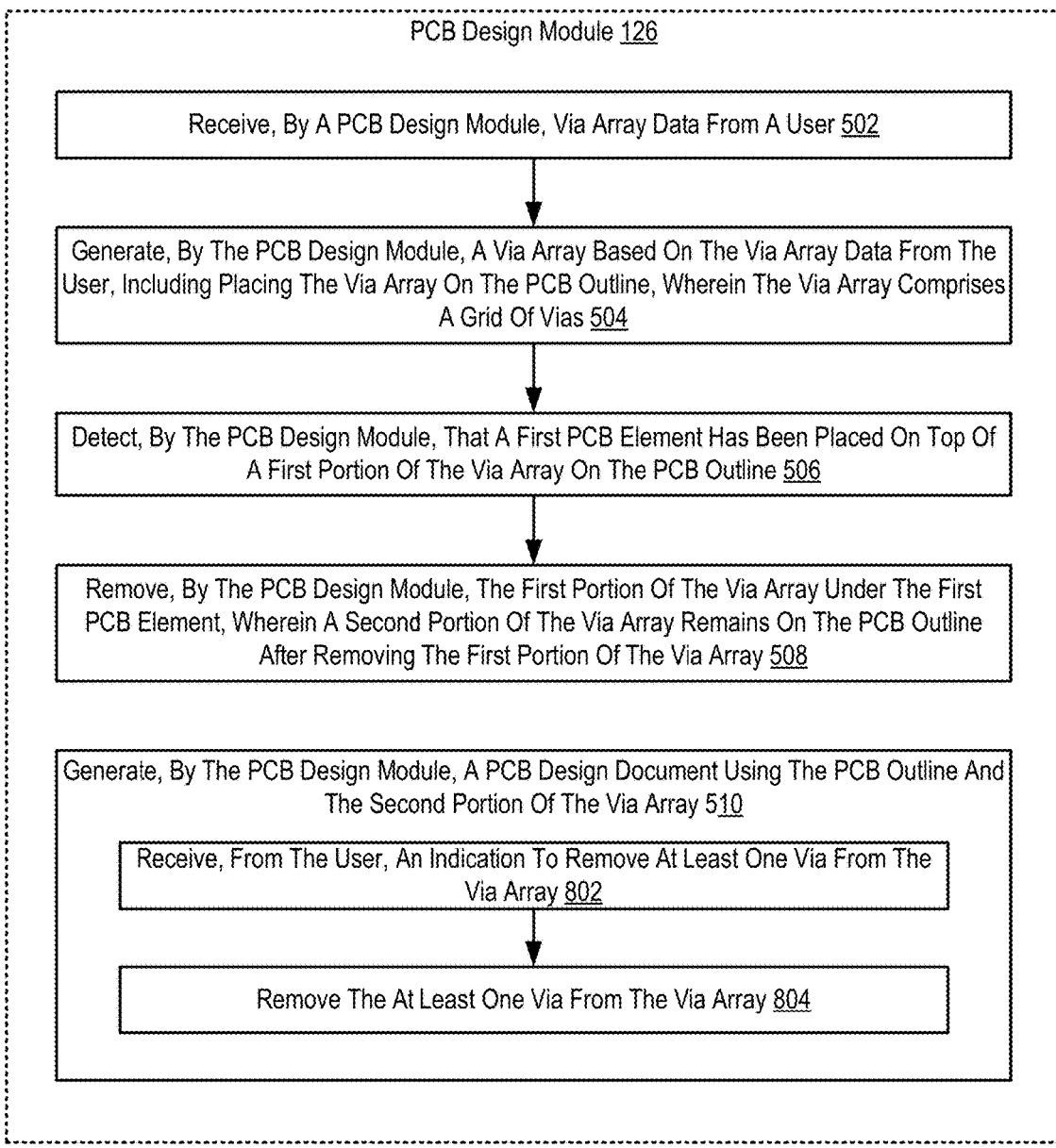
FIG. 8 sets forth a flow chart illustrating an exemplary method for via array placement on a PCB outline according to embodiments of the present invention.

For further explanation, FIG. 8 sets forth a flow chart illustrating a further exemplary method for via array placement on a PCB outline according to embodiments of the present invention that includes receiving (502), by a PCB design module (126), via array data from a user; generating (504), by the PCB design module (126), a via array based on the via array data from the user, including placing the via array on the PCB outline, wherein the via array comprises a grid of vias; detecting (506), by the PCB design module (126), that a first PCB element has been placed on top of a first portion of the via array on the PCB outline; removing (508), by the PCB design module (126), the first portion of the via array under the first PCB element, wherein a second portion of the via array remains on the PCB outline after removing the first portion of the via array; and generating (510), by the PCB design module (126), a PCB design document using the PCB outline and the second portion of the via array.

The method of FIG. 8 differs from the method of FIG. 5, however, in that and generating (510), by the PCB design module (126), a PCB design document using the PCB outline and the second portion of the via array includes receiving (802), from the user, an indication to remove at least one via from the via array; and removing (804) the at least one via from the via array.

Receiving (802), from the user, an indication to remove at least one via from the via array may be carried out by the PCB design module detecting, from the user, an indication that the at least one via is to be removed. Once the user has completed designing the PCB using the PCB design module, each of the remaining vias in the via array may be used in the PCB outline (e.g., as ground vias). Alternatively, the user may want fewer than the remaining vias in the via array for use in the final PCB outline. In that case, at least one of the vias in the via array may be removed.

Removing (804) the at least one via from the via array may be carried out by removing the visual representation of the at least one via. The PCB design module may store information about the deleted at least one via in the event that the via is reinstated.

In view of the explanations set forth above, readers will recognize that the benefits of via array placement on a PCB outline according to embodiments of the present invention include:
- Improving the operation of a computing system by pre-placing via arrays and via fences to aid in PCB design before other PCB elements are added, reduced design time, increased reliability, improved signal integrity, and lowering overall system cost.
- Improving the operation of a computing system by automatically adjusting via fences and via arrays based on user PCB design decisions, increasing computing system functionality and efficiency.

Exemplary embodiments of the present invention are described largely in the context of a fully functional computer system for via array placement on a PCB outline. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of via array placement on a printed circuit board (PCB) outline, the method comprising:
   receiving, by a PCB design module, via array data from a user;
   generating, by the PCB design module, a via array based on the via array data from the user wherein the via array data comprises a grid size, a via size, and a voltage via connection, and generating the via array further comprises generating the via array using the grid size, the via size, and the voltage via connection including placing the via array on the PCB outline, wherein the via array comprises a grid of vias;
   detecting, by the PCB design module, that a first PCB element has been placed on top of a first portion of the via array on the PCB outline;
   removing, by the PCB design module, the first portion of the via array under the first PCB element, wherein a second portion of the via array remains on the PCB outline after removing the first portion of the via array; and
   generating, by the PCB design module, a PCB design document using the PCB outline and the second portion of the via array.

2. The method of claim 1, further comprising:
   receiving, by the PCB design module, via fence data from the user;
   generating, by the PCB design module, a via fence on the PCB outline based on the via fence data from the user; and
   generating an alert in response to detecting, by the PCB design module, that a second PCB element has been placed on top of at least a portion of the via fence on the PCB outline.

3. The method of claim 1, wherein the PCB element is one selected from a group consisting of an electronic component and a net between electronic components.

4. The method of claim 1, further comprising:
   detecting, by the PCB design module, that the first PCB element has been removed from the first portion of the via array on the PCB outline; and
   reinstating, by the PCB design module, the first portion of the via array on the PBC outline.

5. The method of claim 1, wherein generating the PCB design document comprises:
   receiving, from the user, an indication to remove at least one via from the via array; and
   removing the at least one via from the via array.

6. The method of claim 1, wherein generating, by the PCB design module, the via array based on the via array data from the user comprises associating each via in the via array with via properties indicating that the via is part of the via array.

7. An apparatus for via array placement on a printed circuit board (PCB) outline, the apparatus comprising:
   a computer processor; and
   a computer memory operatively coupled to the computer processor, wherein the computer memory comprises computer program instructions that, when executed by the computer processor, cause the computer processor to carry out the steps of:
   receiving, via array data from a user;
   generating a via array based on the via array data from the user wherein the via array data comprises a grid size, a via size, and a voltage via connection, and generating the via array further comprises generating the via array using the grid size, the via size, and the voltage via connection including placing the via array on the PCB outline, wherein the via array comprises a grid of vias;
   detecting that a first PCB element has been placed on top of a first portion of the via array on the PCB outline;
   removing the first portion of the via array under the first PCB element, wherein a second portion of the via array remains on the PCB outline after removing the first portion of the via array; and
   generating a PCB design document using the PCB outline and the second portion of the via array.

8. The apparatus of claim 7, the computer program instructions, when executed, further cause the computer processor to carry out the steps of:
receiving via fence data from the user;
generating a via fence on the PCB outline based on the via fence data from the user; and
generating an alert in response to detecting that a second PCB element has been placed on top of at least a portion of the via fence on the PCB outline.

9. The apparatus of claim 7, wherein the PCB element is one selected from a group consisting of an electronic component and a net between electronic components.

10. The apparatus of claim 7, the computer program instructions, when executed, further cause the computer processor to carry out the steps of:
detecting that the first PCB element has been removed from the first portion of the via array on the PCB outline; and
reinstating the first portion of the via array on the PBC outline.

11. The apparatus of claim 7, wherein generating the PCB design document comprises:
receiving, from the user, an indication to remove at least one via from the via array; and
removing the at least one via from the via array.

12. The apparatus of claim 7, wherein generating the via array based on the via array data from the user comprises associating each via in the via array with via properties indicating that the via is part of the via array.

13. A computer program product for via array placement on a printed circuit board (PCB) outline, the computer program product disposed upon a computer readable medium, the computer program product comprising computer program instructions that, when executed, cause a computer to carry out the steps of:
receiving, by a PCB design module, via array data from a user;
generating, by the PCB design module, a via array based on the via array data from the user wherein the via array data comprises a grid size, a via size, and a voltage via connection, and generating the via array further comprises generating the via array using the grid size, the via size, and the voltage via connection including placing the via array on the PCB outline, wherein the via array comprises a grid of vias;
detecting, by the PCB design module, that a first PCB element has been placed on top of a first portion of the via array on the PCB outline;
removing, by the PCB design module, the first portion of the via array under the first PCB element, wherein a second portion of the via array remains on the PCB outline after removing the first portion of the via array; and
generating, by the PCB design module, a PCB design document using the PCB outline and the second portion of the via array.

14. The computer program product of claim 13, the computer program instructions, when executed, further cause the computer to carry out the steps of:
receiving, by the PCB design module, via fence data from the user;
generating, by the PCB design module, a via fence on the PCB outline based on the via fence data from the user; and
generating an alert in response to detecting, by the PCB design module, that a second PCB element has been placed on top of at least a portion of the via fence on the PCB outline.

15. The computer program product of claim 13, wherein the PCB element is one selected from a group consisting of an electronic component and a net between electronic components.

16. The computer program product of claim 13, the computer program instructions, when executed, further cause the computer to carry out the steps of:
detecting, by the PCB design module, that the first PCB element has been removed from the first portion of the via array on the PCB outline; and
reinstating, by the PCB design module, the first portion of the via array on the PBC outline.

17. The computer program product of claim 13, wherein generating the PCB design document comprises:
receiving, from the user, an indication to remove at least one via from the via array; and
removing the at least one via from the via array.

* * * * *